(12) United States Patent
Zhang et al.

(10) Patent No.: US 6,297,132 B1
(45) Date of Patent: Oct. 2, 2001

(54) PROCESS TO CONTROL THE LATERAL DOPING PROFILE OF AN IMPLANTED CHANNEL REGION

(75) Inventors: Jiong Zhang; Kai Shao; Shao-Fu Sanford Chu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/498,978

(22) Filed: Feb. 7, 2000

(51) Int. Cl.⁷ .................................................. H01L 21/425
(52) U.S. Cl. .......................... 438/514; 438/156; 438/250; 438/253; 257/67; 257/329
(58) Field of Search .................................. 438/514, 253, 438/250, 156; 257/67, 329

(56) References Cited

U.S. PATENT DOCUMENTS

| | | | |
|---|---|---|---|
| 5,283,455 | * 2/1994 | Inoue et al. | 257/329 |
| 5,334,862 | * 8/1994 | Manning et al. | 257/67 |
| 5,472,897 | 12/1995 | Hsu et al. | 437/44 |
| 5,600,168 | 2/1997 | Lee | 257/336 |
| 5,686,321 | 11/1997 | Ko et al. | 437/29 |
| 5,792,687 | * 8/1998 | Jeng et al. | 438/253 |
| 5,856,225 | 1/1999 | Lee et al. | 438/291 |
| 5,879,998 | 3/1999 | Krivokapic | 438/300 |
| 5,937,297 | 8/1999 | Peidous | 438/270 |

* cited by examiner

Primary Examiner—Richard Elms
Assistant Examiner—Pho Luu
(74) Attorney, Agent, or Firm—George O. Saile; Rosemary L. S. Pike

(57) ABSTRACT

A process for fabricating a MOSFET device, featuring a narrow lateral delta doping, or a narrow anti-punchthrough region, located in the center of the MOSFET channel region, has been developed. The process features formation of the narrow, anti-punchthrough region, via use of an ion implantation procedure, performed using an opening, comprised with sidewall spacers, as an implant mask. After formation of the narrow, anti-punchthrough region, the sidewall spacers are removed, and a gate insulator layer, and a polysilicon gate structure, are formed in the spacerless opening, defining a channel region wider than the narrow, anti-punchthrough region.

18 Claims, 4 Drawing Sheets

PROCESS TO CONTROL THE LATERAL DOPING PROFILE OF AN IMPLANTED CHANNEL REGION

BACKGROUND OF THE INVENTION (1) Field of the Invention

The present invention relates to methods used to fabricate semiconductor devices, and more specifically to a process used to control the doping profile of the channel region, in a lateral direction, formed via ion implantation procedures, in the channel region of a metal oxide semiconductor field effect transistor, (MOSFET), device.

(2) Description of Prior Art

The continuing objective of increasing device density, and increasing device performance, via micro-miniaturization, or via the use of sub-micron features for MOSFET devices, has led the semiconductor devices has directed the semiconductor industry to the fabrication of MOSFET device with channel lengths as narrow as 0.18 um, Although the use of MOSFET devices, featuring narrow channel lengths, have satisfied the density and performance objectives of the semiconductor industry, formation of specific regions of the sub-micron MOSFET devices, such lightly doped source/drain, (LDD), regions, as well as an anti-punchthrough region, located in the channel region of the MOSFET device, have become more difficult to achieve and control For example the ion implantation, used to form the LDD, or source/drain extensions, can result in encroaching, sphere-like profiles, sometimes decreasing the designed channel length, or effective channel length, (Leff), to an undesirable length of less than 0.18 um. In addition, subsequent high temperature processing steps, can result in lateral diffusion of the LDD regions, again resulting in an undesirable shortening of the channel length. For these reasons a lateral delta doping region, or an anti-punchthrough region, is placed in the channel region, between LDD regions to insure the integrity of the dimension of the channel length, as well as to minimize jointing, or touching of the depletion regions created at the junction of the LDD regions, and the semiconductor substrate.

This invention will describe a process for forming a lateral delta doping region, which has the added advantage of serving as an anti-punchthrough region, between LDD regions. However this invention will feature an anti-punchthrough region that will consume less lateral space in the channel region, than counterpart anti-punchthrough regions, fabricating without the use of this invention, thus still reducing the LDD jointing phenomena, however also reducing the capacitance generated with larger area, anti-punchthrough regions. The smaller area, or truncated, anti-punchthrough region, is formed via a novel process sequence, featuring the formation of spacers, on the sides of a trench shape, which will subsequently be used to accommodate a polysilicon gate structure, followed by the anti-punchthrough ion implantation procedure, placing the lateral delta doping region in an area of the subsequent channel region, reduced in lateral dimension by the presence of the spacers. Prior art, such as Lee et al, in U.S. Pat. No. 5,856,225, shows a anti-punchthrough region formed in a trench, with the trench next filled with a polysilicon gate structure. In that prior art however the critical gate insulator layer, as well as the critical sidewall spacers, are subjected to the removal of the dummy gate structure, and thus used as part of the final gate structure. In contrast this invention does not feature the use of a dummy gate structure, and therefore the gate insulator layer, and sidewall spacers, are not formed prior to the anti-punchthrough region, and therefore are not subjected to the processes used to form and to remove, the insulator shape, which in turn is used to provide the trench needed for definition of the MOSFET polysilicon gate structure.

SUMMARY OF THE INVENTION

It is an object of this invention to form a lateral delta doping profile, or a narrow, antipunchthrough region, in a portion of the channel region, of the MOSFET device.

It is another object of this invention to form a first opening in an insulator layer, overlying the subsequent channel region, in a semiconductor substrate, then form spacers on the sides of the first opening in the insulator layer, to create a narrower, second opening in the insulator layer.

It is yet another object of this invention to form the anti-punchthrough region, in a portion of the semiconductor substrate, using the second opening in the insulator layer, as a mask.

It is still yet another object of this invention to form a polysilicon gate structure in the first opening in the insulator layer.

In accordance with the present invention a process for forming a narrow, anti-punchthrough region, laterally located in the center of a subsequent channel region of a MOSFET device, via an ion implantation procedure performed through an opening in an insulator layer, which has been narrowed via use of inside spacers, located on the sides of an opening in the insulator layer, is described. A first opening is made in a silicon nitride-silicon oxide, composite insulator layer, exposing the portion of a semiconductor substrate to be used for a MOSFET channel region. After formation of a threshold voltage adjust, ion implantation procedure, in a region of the semiconductor substrate, not covered by the composite insulator layer, or into the region of the semiconductor substrate exposed in the first opening in the composite insulator layer, polysilicon, or polysilicon-silicon oxide, first spacers, are formed on the sides of the first opening, creating a second opening, reduced in width by the addition of the first spacers on the sides of the first opening in the composite insulator layer. A lateral delta doping, or an antipunchthrough region, is then formed via an ion implantation procedure, in a region of the semiconductor substrate not covered by the composite insulator layer, or by the first spacers. After selective removal of the first spacers, a gate insulator layer is grown on the region of the semiconductor substrate exposed in the first opening. A polysilicon layer is next deposited, than subjected to a chemical mechanical polishing procedure, creating a polysilicon gate structure, in the first opening, in the composite insulator layer. After selective removal of the composite insulator layer, lightly doped source/drain regions are formed in a region of the semiconductor substrate, not covered by the polysilicon gate structure. This is followed by the formation of second spacers, on the sides of the polysilicon gate structure, and the formation of heavily doped source/drain regions, in a region of the semiconductor substrate, not covered by the polysilicon gate structure, or by the second spacers.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
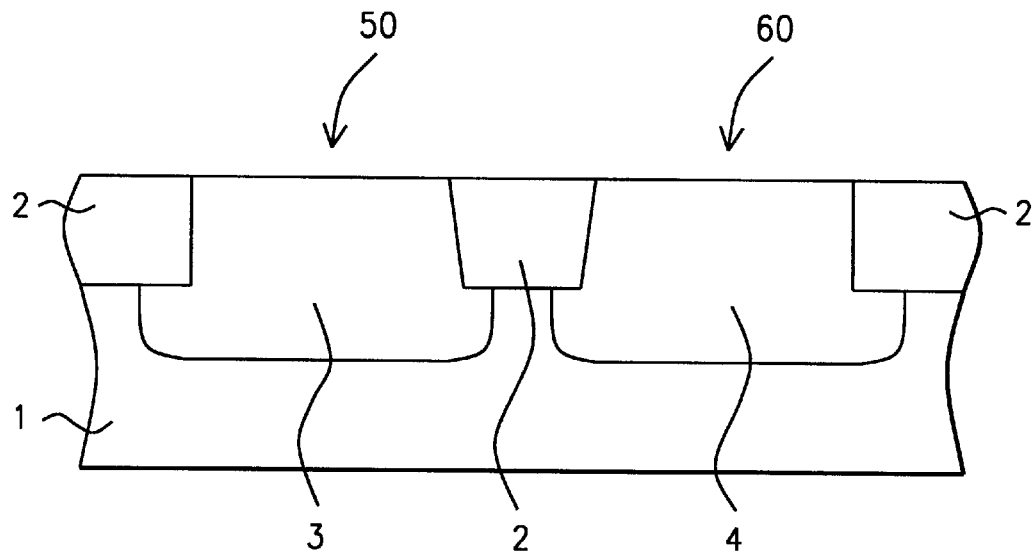
FIGS. 1–7, which schematically, in cross-sectional style, describe key stages of fabrication used to fabricate a narrow, anti-punchthrough region, for a MOSFET device, via an ion implantation procedure, performed in a center portion of the MOSFET channel region.

The method of forming a lateral delta doping region, and also a narrow anti-punchthrough region, in a center portion of a channel region, of a MOSFET device, featuring an ion implantation procedure performed to a region of a semiconductor substrate, exposed in an opening in a disposable insulator shape, and with the opening narrowed via the use of disposable spacers on the sides of the opening in the disposable insulator shape, will now be described in detail. This invention will be described for complimentary MOSFET devices, or CMOS devices, comprised with both N channel, (NFET), devices, as well as with P channel devices, (PFET). However this invention can be applied to either only NFET, or only PFET devices. A P type, semiconductor substrate 1, comprised of single crystalline silicon, with a <100> crystallographic orientation is used and schematically shown in FIG. 1. Isolation regions 2, shown schematically in FIG. 1, can be comprised of thermally grown, field oxide, (FOX), regions, at a thickness between about 3000 to 5000 Angstroms, or isolation regions 2, can be comprised with insulator filled shallow trenches, with the depth of the shallow trench, in the semiconductor substrate, being between about 3000 to 4000 Angstroms. Conventional photolithographic masking procedures are then used to protect the PFET region 60, from an ion implantation procedure used to create P well region 3, in NFET region 50. The ion implantation procedure is performed using boron, or $BF_2$ ions, at an energy, for the boron ions, between about 150 to KeV, at dose between about 1E13 to 2E13 atoms/$cm^2$, creating P well region 3, with the P well region featuring a higher P type dopant concentration than the P type, dopant concentration of semiconductor substrate 1. After removal of the photoresist mask, used to protect PFET region 60, from the P well ion implantation procedure, another photoresist shape is formed, protecting NFET region 50, from an ion implantation procedure used to create N well region 4, in PFET region 60. This is accomplished via implantation of either arsenic, or phosphorous ions, at an energy, for phosphorous ions, between about 400 to 500 KeV, at a dose between about 1E13 to 2E13 atoms/$cm^2$. The photoresist shape used to protect NFET region 50, from the N well, ion implantation procedure, is removed via plasma oxygen ashing and careful wet cleans. The result of these procedures is schematically shown in FIG. 1.

Figure 2:
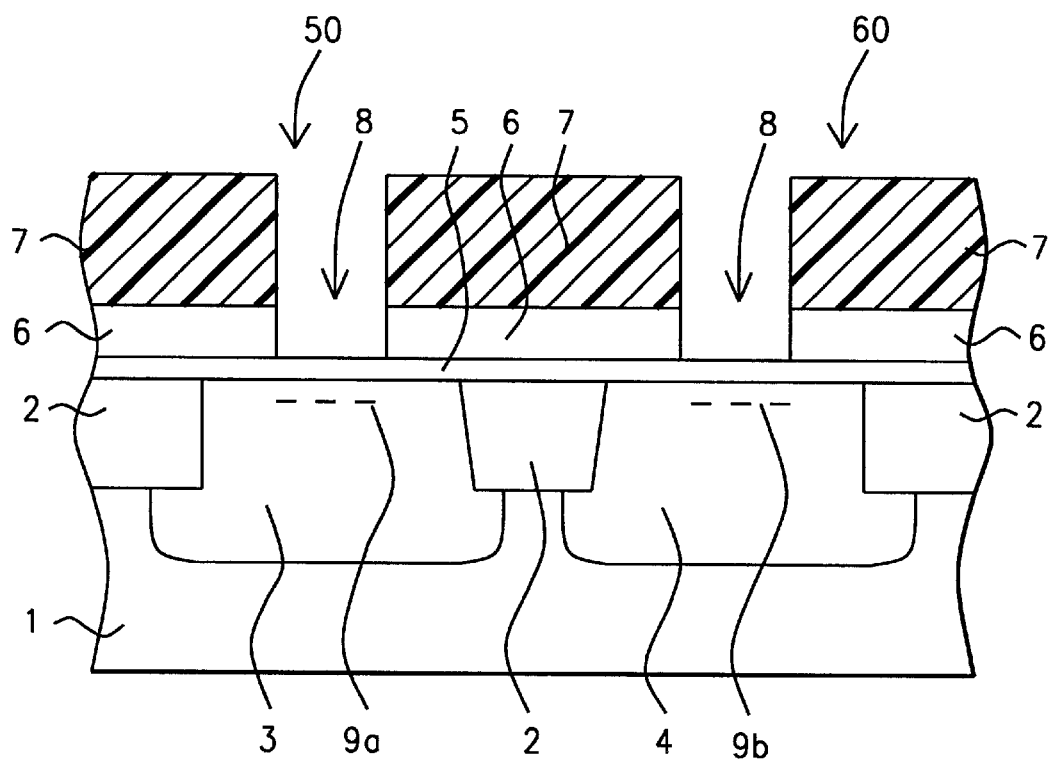

First openings, defining subsequent channel regions, for both NFET and PFET regions, is next addressed and schematically described in FIG. 2. A composite insulator is first formed on the top surface of semiconductor substrate 1. A thin, underlying silicon oxide layer 5, is first formed to a thickness between about 100 to 1000 Angstroms, via use of either: a low pressure chemical vapor deposition, (LPCVD), procedure; a plasma enhanced chemical vapor deposition procedure, (PECVD); or via a thermal oxidation procedure. Silicon nitride layer 6, is next deposited, via LPCVD or PECVD procedures, to a thickness between about 1000 to 4000 Angstroms, overlying silicon oxide layer 5. Conventional photolithographic and anisotropic, reactive ion etching,.(RIE), procedures, using photoresist shape 7, as a mask, and using $Cl_2$, as an etchant, are used to form first openings 8, in silicon nitride layer 6. First openings 8, are defined using the reverse mask, that is normally used for conventional definition of a polysilicon gate structure. The dimension, or width of first openings 8, between about 0.10 to 1.0 um, will determine the channel length of the subsequent MOSFET devices. Ion implantation procedures are next used to create threshold adjust region 9a, in NFET region 50, and threshold adjust region 9b, in PFET region 60. If different implant species and conditions are needed for each MOSFET type, multiple photoresist masking procedures are employed to block either the NFET or PFET region during the creation of the threshold adjust region, for the other MOSFET type. This is accomplished for threshold adjust region 9a, in NFET region 50, via implantation of either boron, or $BF_2$ at an energy for $BF_2$ ions between about 40 to 60 KeV, at a dose between about 3E12 to 5E12 atoms $cm^2$, while phosphorous ions, are implanted at an energy between about 40 to 60 KeV, at a dose between about 2E12 to 4E12 atoms/$cm^2$, to form threshold adjust region 9b, in PFET region 60.

Figure 3:
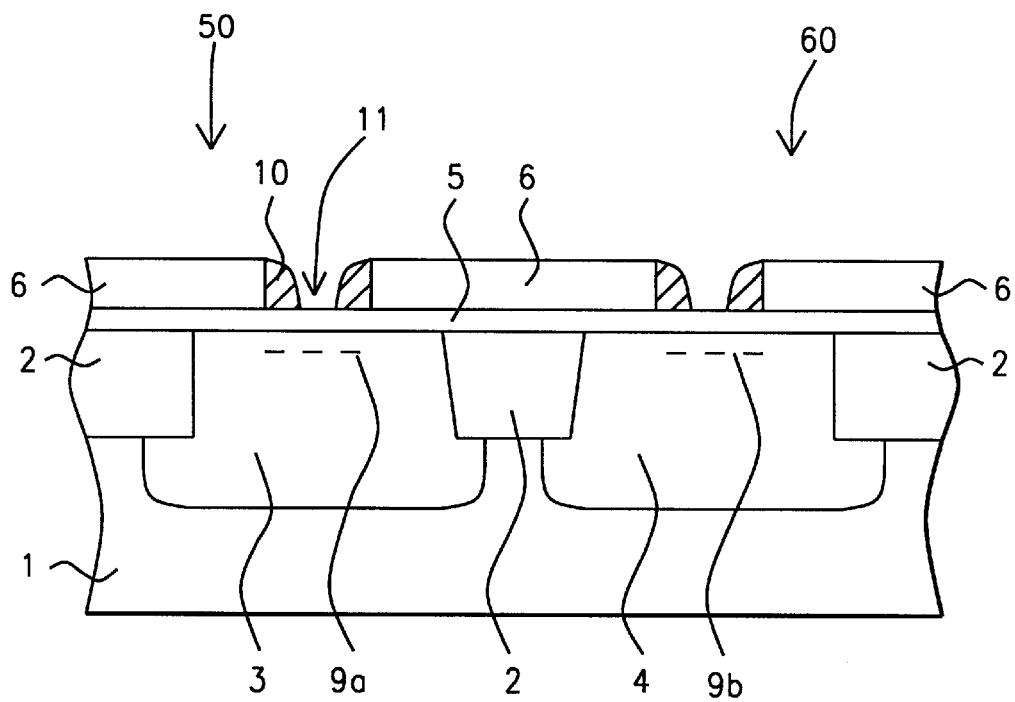

After removal the photoresist shapes used to form the specific threshold voltage region for either the NFET or PFET regions, first spacers 10, are formed on the sides of first openings 8. This is schematically shown in FIG. 3. First spacers 10, can be comprised of polysilicon, or first spacers 10, can be composite spacers, comprised of an overlying polysilicon shape, and an underlying silicon oxide shape. This invention will be described using only the polysilicon shape for first spacers 10, however if the composite spacers are used, the underlying silicon oxide component would be between about 100 to 1000 Angstroms, in thickness. This is accomplished via deposition of an intrinsic polysilicon layer, via an LPCVD procedure, at a thickness between about 500 to 2000 Angstroms. A selective, anisotropic RIE procedure, using $HBr/Cl_2/O_2$ as an etchant, is next employed to create first spacers 10, on the sides of first opening 8, resulting in second openings 11, with a dimension, or with a width, between about 0 to 0.10 um, for short channel length devices. For long channel length devices, opening 11, approximates the channel length.

Figure 4:
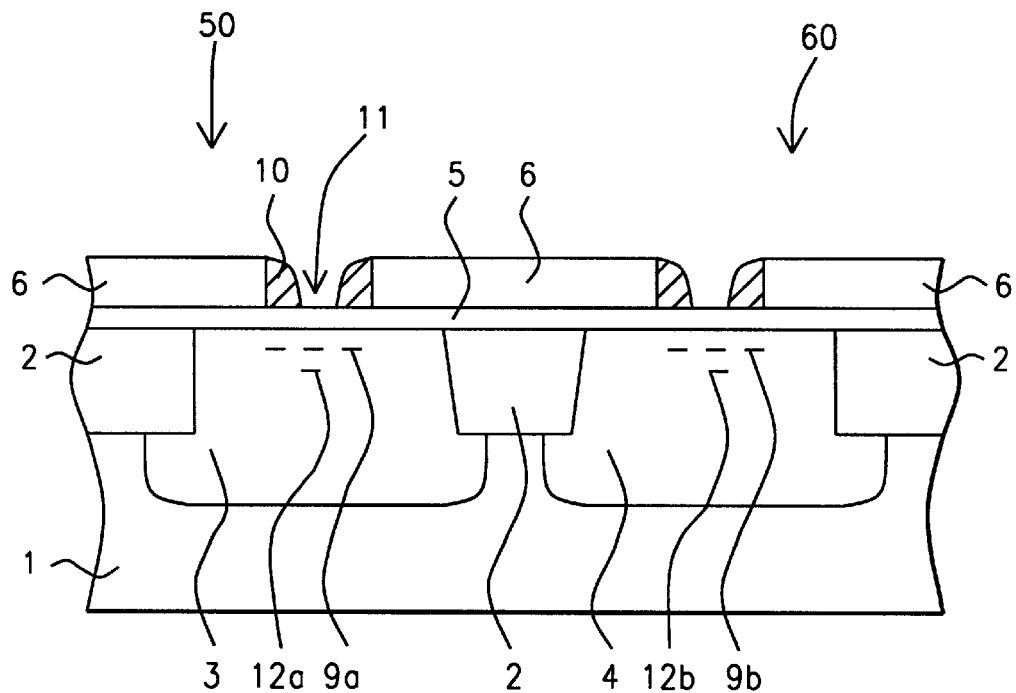

Second openings 11, will serve as a mask, to allow ion implantation procedures to create the lateral delta doping regions, and also the anti-punchthrough regions, placed only in center portion of the channel region. To create anti-punchthrough region 12a, in NFET region 50, a photoresist shape is used to protect PFET region 60, from implantation of boron or $BF_2$ ions, performed at an energy, using boron ions, between about 20 to 60 KeV, at a dose between about 5E12 to 2E13 atoms/$cm^2$. Anti-punchthrough region 12a, with a P type dopant concentration greater than the P type dopant concentration of P well region 3, will reduce jointing, or depletion region encroachment, at the interface of a subsequent LDD and semiconductor interface. However the ability to restrict the area of the lateral doping region, (the anti-punchthrough region), to only the center portion of the channel region, will result in less capacitance than counterparts fabricated with anti-punchthrough regions located across the entire length of channel region. After removal of the photoresist shape, used to mask PFET region 60, from the process used to create anti-punchthrough region 12a, another photoresist shape is formed to protect NFET region 50, from the ion implantation procedure used to create anti-punchthrough region 12b, in PFET region 60. This is accomplished via implantation of arsenic, or phosphorous ions, at an energy, using phosphorous ions, between about 40 to 150 KeV, and at a dose between about 5E12 to 2E13 atoms/$cm^2$. Again as was the case for anti-punchthrough region 12a, the N type dopant concentration of anti-punchthrough region 12b, is greater than the N type dopant concentration of N well region 4, thus restricting subsequent depletion region encroachment. The result of these procedures, used for creation of the anti-punchthrough regions, is schematically shown in FIG. 4.

After removal of the photoresist shape, used to protect NFET region 50, from the ion implantation procedure used to create anti-punchthrough region 12b, in PFET region 60, first spacers 10, are removed using either wet etch procedures, or via selective dry etching procedures, removing the polysilicon, or polysilicon-silicon oxide spacers, from the sides of first opening 8. The dry etching option is accomplished using $CHF_3$ as an etchant for either polysilicon, or the polysilicon-silicon oxide composite, while KOH is used fir the wet etchant option, for first spacer removal. The region of silicon oxide layer 5, exposed in first opening 8, is selectively removed via use of a buffered hydrofluoric acid solution, exposing the top surface of the channel regions of the MOSFET devices. A thermal oxidation procedure, performed in an oxygen-steam ambient, at a temperature between about 850 to 950° C., is next used to grow silicon dioxide, gate insulator layer 13, at a thickness between about 30 to 90 Angstroms, on the exposed top surfaces of the channel regions. The temperature used for formation of silicon dioxide layer 13, results in activation of the previously implanted ions, creating threshold regions 9a, and 9b, in NFET region 50, and PFET region 60, respectfully, as well as creating anti-punchthrough region 12a, and 12b, again in NFET region 50, and in PFET region 60, respectfully. The narrow, anti-punchthrough regions, narrower in width than first opening 8, are comprised with a wedge shape, that is wider at the bottom, and narrower at the top. The shape of the narrow, anti-punchthrough regions is a result of the implantation procedure, where the implanted ions will endure a greater number of collisions as it goes deeper into the substrate. Therefore the doping profile will disperse in a large scope at the bottom of the lateral doping profile, resulting in the wedge shape profile, schematically shown FIG. 5.

Figure 5:
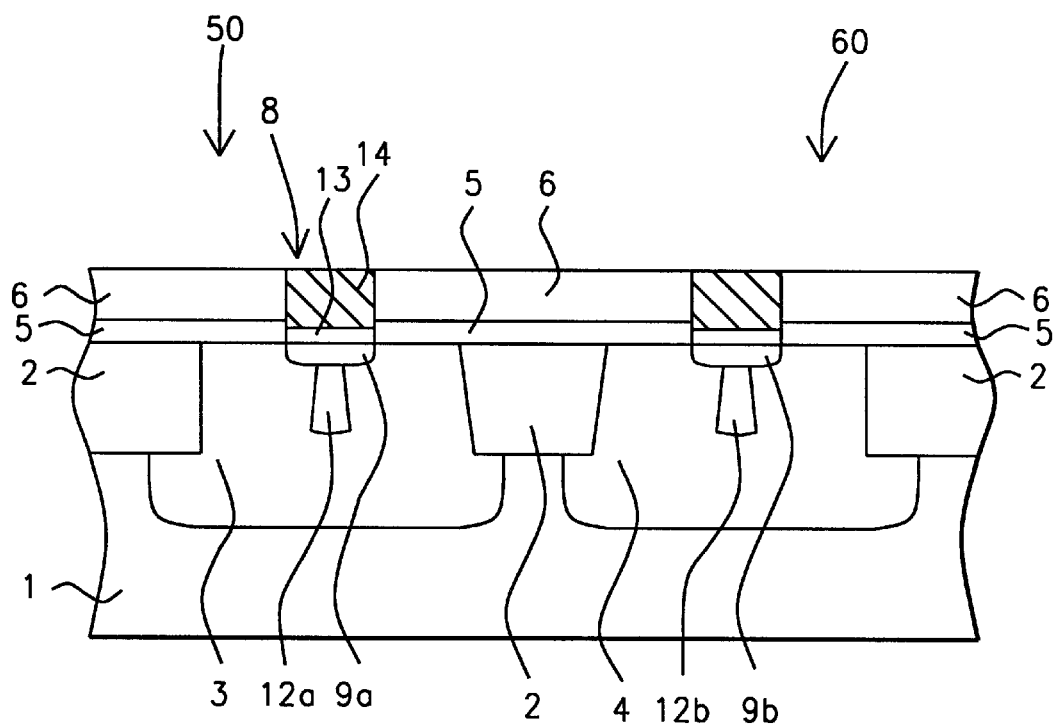

A polysilicon layer is next deposited, via LPCVD procedures, to a thickness between about 2000 to 3000 Angstroms, completely filling first opening 8. The polysilicon layer can be doped in situ, during deposition, via the addition of arsine, or phosphine, to a silane ambient, or the polysilicon can be deposited intrinsically than doped via implantation of arsenic or phosphorous ions. Removal of regions of the polysilicon layer, from the top surface of silicon nitride layer 6, is accomplished via chemical mechanical polishing procedures, resulting in the creation of polysilicon gate structure 14, in first opening 8. Polysilicon gate structure 14, schematically shown in FIG. 5, is defined by first opening 8, which in turn was used to define the subsequent channel regions, for the MOSFET devices. If desired unwanted regions of polysilicon can be removed from the top surface of silicon nitride layer 6, via a selective, RIE procedure, using $CHF_3$ as an etchant.

Figure 6:
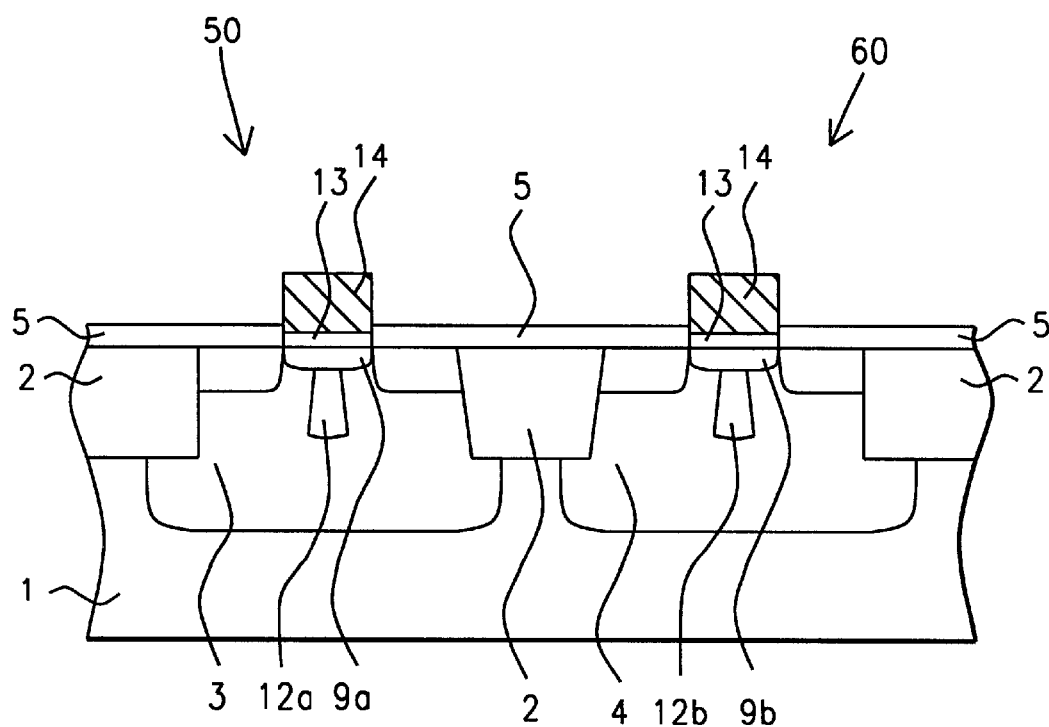

Removal of silicon nitride layer 6, and of silicon oxide layer 5, the layers used to define first opening 8, is next addressed. Silicon nitride layer 6, is removed via use of a hot phosphoric acid solution, resulting in polysilicon gate structures 14, on silicon dioxide, gate insulator layer 13, Lightly doped source/drain, (LDD), regions, are next formed in regions of semiconductor substrate, not covered by polysilicon gate structures 14, via ion implantation procedures. A photoresist shape is first used to protect PFET region 60, from an ion implantation procedure, used to create N type, LDD regions 15a, in NFET region 50. This is accomplished via implantation of arsenic, or phosphorous ions, at an energy, using arsenic ions, between about 10 to 30 KeV, at a dose between about 2E13 to 2E14 atoms/cm². After removal of the masking photoresist shape, another photoresist shape is used to protect NFET region 50, from an ion implantation procedure, used to form P type, LDD region 15b, in PFET region 60. This is accomplished via implantation of boron or $BF_2$ ions, at an energy between about 10 to 30 KeV, at a dose between about 1E13 to 1E14 atoms/cm². The photoresist shape, used to protect NFET region 50, from the P type, LDD implantation procedure, is then removed via plasma oxygen ashing and careful wet cleans. The results of these procedures, is schematically shown in FIG. 6.

Figure 7:
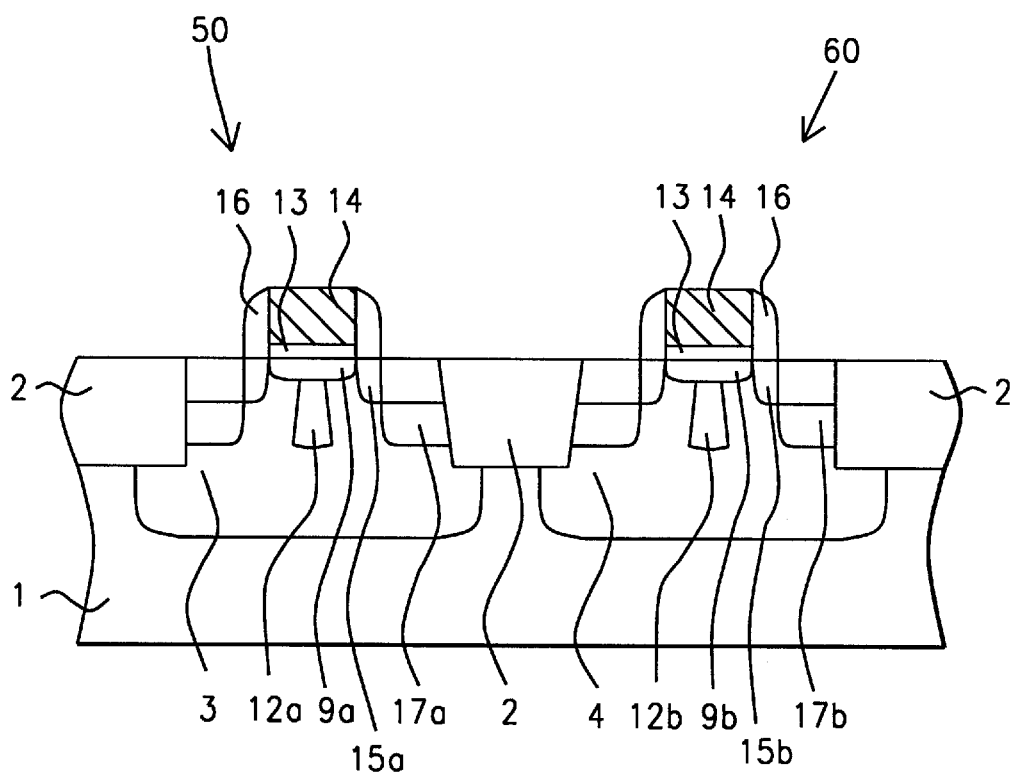

Removal of silicon oxide layer 5, is next addressed via use of a buffered hydrofluoric acid solution, followed by the formation of second spacers 16, on the sides of polysilicon gate structures 14. This is accomplished via the deposition of an insulator layer, such as silicon oxide, via LPCVD or PECVD procedures, at a thickness between about 1000 to 1500 Angstroms, followed by an anisotropic RIE procedure, using $CHF_3$ as an etchant. If desired second insulator spacers can be comprised of silicon nitride, again formed via LPCVD, or PECVD procedures, followed by blanket RIE processing. Heavily doped source/drain regions, are then formed in regions of the semiconductor substrate not covered by polysilicon gate structures 14, or by second spacers 16. Again photoresist masking is used to protect PFET region 60, from implantation of arsenic, or phosphorous ions, at an energy, using arsenic ions, between about 30 to 50 KeV, at a dose between about 2E15 to 5E15 atoms/cm², creating heavily doped, N type source/drain region 17a, in NFET region 50. After removal of the photoresist shape, used to protect PFET region 60, during formation of heavily doped, N type source/drain region 17a, another photoresist shape is used to protect NFET region 50, from the ion implantation procedure, used to create heavily doped, P type source/drain region 17b, in PFET region 60. This is accomplished via implantation of boron, or $BF_2$ ions, at an energy, using $BF_2$ ions, between about 30 to 50 KeV, at a dose between about 2E15 to 5E15 atoms/cm². After removal of the masking photoresist shape, via plasma oxygen ashing and careful wet cleans, the implanted ions, in both the LDD and the heavily doped source/drain regions, are activated via use of an anneal, performed in either a conventional furnace, or in a rapid thermal anneal, (RTA), furnace, at a temperature between about 900 to 1000° C. The formation of the heavily doped, source/drain regions is schematically shown in FIG. 7.

The ability to create a narrow lateral delta doping region, or a narrow anti-punchthrough region, in the channel region, reduces the risk of LDD jointing, either during LDD implantation, or as a result of depletion region encroachment. In addition the ability to limit the area of the narrow, anti-punchthrough region, to be located only in the center of the channel region, limits the additional capacitance created by the anti-punchthrough region. The capacitance generated at the junction of the source/drain to substrate, is reduced by about 50%.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a metal oxide semiconductor field effect, (MOSFET), device, on a semiconductor substrate, comprising the steps of:

forming a well region, in said semiconductor substrate;

forming a first opening, with a width between about 0.10 to 1.0 um, in a composite insulator layer, exposing a portion of said well region to be used for a channel region, for said MOSFET device;

forming a threshold voltage adjust region in a top portion of said channel region;

forming first spacers on the sides of said first opening, in said composite insulator layer, resulting in a second opening, with a width between about 0 to 0.10 um, wherein said first spacers, on the sides of said first opening, are between about 500 to 2000 Angstroms in thickness, comprised of either polysilicon, at a thickness between about 500 to 2000 Angstroms, or comprised of a composite polysilicon-silicon oxide layer, at a thickness between about 600 to 3000 Angstroms;

forming a narrow lateral delta doping region in a bottom portion of said channel region, exposed in said second opening, with said narrow, anti-punchthrough region, deeper in said channel region, than said threshold voltage adjust region;

removing said first spacers from the sides of said first opening;

growing a gate insulator layer on the top surface of said channel region, exposed in said first opening;

forming a polysilicon gate structure, on said gate insulator layer, in said first opening;

removing said composite insulator layer;

forming a lightly doped source/drain region, in an area of said semiconductor substrate, not covered by said polysilicon gate structure;

forming second spacers on the sides of said polysilicon gate structure; and forming a heavily doped source/drain region, in an area of said semiconductor substrate, not covered by said polysilicon gate structure, or by said second spacers.

2. The method of claim 1, wherein said MOSFET device is an N channel device, formed in a P well region, located in said semiconductor substrate.

3. The method of claim 1, wherein said MOSFET device is a P channel device, formed in an N well region, located in said semiconductor substrate.

4. The method of claim 1, wherein said well region, in said semiconductor substrate, is either a P well region, to be used for N channel, MOSFET devices, or an N well region, to be used for P channel, MOSFET devices.

5. The method of claim 1, wherein said composite insulator layer is comprised of an underlying silicon oxide layer, obtained via LPCVD, PECVD, or thermal oxidation procedures, at a thickness between about 100 to 1000 Angstroms, and comprised with an overlying silicon nitride layer, obtained via LPCVD or PECVD procedures, at a thickness between about 1000 to 4000 Angstroms.

6. The method of claim 1, wherein said narrow lateral delta doping region, for an N channel, MOSFET device is formed via ion implantation of boron, or $BF_2$ ions, at an energy, using boron ions, between about 20 to 60 KeV, at a dose between about 5E12 to 2E13 atoms/$cm^2$.

7. The method of claim 1, wherein said narrow lateral delta region, for a P channel, MOSFET device is formed via ion implantation of phosphorous, or arsenic ions, at an energy, using phosphorous between about 40 to 150 KeV, at a dose between about 5E12 to 2E13 atoms/$cm^2$.

8. The method of claim 1, wherein said gate insulator layer is a silicon dioxide layer, at a thickness between about 30 to 90 Angstroms, obtained via thermal oxidation procedures, in an oxygen-steam ambient.

9. The method of claim 1, wherein said polysilicon gate structure is obtained via deposition of a polysilicon layer, via LPCVD procedures, to a thickness between about 2000 to 3000 Angstroms, then defined via chemical mechanical polishing procedures, forming said polysilicon gate structure, in said first opening.

10. A method of forming a MOSFET device, on a semiconductor substrate, featuring a narrow delta doping region, formed in the center of the channel region, in said MOSFET device, comprising the steps of:

forming a well region, in said semiconductor substrate;

forming a composite insulator layer on said semiconductor substrate, with said composite insulator layer comprised of an overlying silicon nitride layer, and an underlying silicon oxide layer;

forming a first opening, with a width between about 0.10 to 1.0 um, in said composite insulator layer, exposing a portion of the top surface of said well region, with said first opening defining the dimension for said channel region;

forming a threshold adjust region in a top portion of said channel region, exposed in said first opening;

forming first spacers on the sides of said first opening in said composite insulator layer, at a thickness between about 600 to 3000 Angstroms with said first spacers comprised with said underlying silicon oxide layer, at a thickness between about 100 to 1000 Angstroms, and comprised with said overlying polysilicon layer, at a thickness between about 500 to 2000 Angstroms, creating said second opening, with a width between about 0 to 0.10 um;

forming said narrow delta doping region, in a lower portion of said channel region, using said second opening as a mask;

removing said second spacers from sides of said composite insulator layer, re-establishing said first opening;

growing a silicon dioxide gate insulator layer on the top surface said channel region, exposed in said first opening;

depositing an in sit doped, polysilicon layer;

removing regions of said in sit doped, polysilicon layer, from the top surface of said composite insulator layer, creating a polysilicon gate structure, on said silicon dioxide gate insulator layer, in said first opening;

removing said composite insulator layer;

forming a lightly doped source/drain region, in an area of said semiconductor substrate not covered by said polysilicon gate structure;

forming second spacers on the sides of said polysilicon gate structure;

forming a heavily doped source/drain region, in an area of said semiconductor substrate not covered by said polysilicon gate structure, or by said second spacers; and performing an anneal procedure.

11. The method of claim 10, wherein said MOSFET device is an N channel device, formed in a P well region, located in said semiconductor substrate.

12. The method of claim 10, wherein said MOSFET device is a P channel device, formed in an N well region, located in said semiconductor substrate.

13. The method of claim 10, wherein said well region, in said semiconductor substrate, is either a P well region, to be used for N channel, MOSFET devices, or an N well region, to be used for P channel, MOSFET devices.

14. The method of claim 10, wherein said underlying silicon oxide layer, of said composite insulator layer, is obtained via LPCVD, PECVD, or thermal oxidation procedures, at a thickness between about 100 to 1000 Angstroms, and wherein said overlying silicon nitride layer, of said composite insulator layer, is obtained via LPCVD or PECVD procedures, at a thickness between about 1000 to 4000 Angstroms.

15. The method of claim 10, wherein said narrow delta doping region, for an N channel, MOSFET device is formed via ion implantation of boron, or $BF_2$ ions, at an energy, using boron ions, between about 20 to 60 KeV, at a dose between about 5E12 to 2E13 atoms/$cm^2$.

16. The method of claim 10, wherein said narrow delta doping region, for a P channel, MOSFET device is formed via ion implantation of phosphorous, or arsenic ions, at an energy, using phosphorous ions, between about 40 to 150 KeV, at a dose between about 5E12 to 2E13 atoms/$cm^2$.

17. The method of claim 10, wherein said silicon dioxide gate insulator layer is formed to a thickness between about 30 to 90 Angstroms, via a thermal oxidation procedure, in an oxygen-steam ambient, at a temperature between about 850 to 950° C.

18. The method of claim 10, wherein said anneal, is performed using conventional furnace procedures, or performed using rapid thermal anneal, (RTA), procedures, at a temperature between about 900 to 100° C.

* * * * *